(12) United States Patent
Fagan et al.

(10) Patent No.: US 7,233,185 B2
(45) Date of Patent: Jun. 19, 2007

(54) VERNIER CIRCUIT FOR FINE CONTROL OF SAMPLE TIME

(75) Inventors: John L. Fagan, Pasadena, MD (US); Mark A. Bossard, Upper Marlboro, MD (US); Daniel S. Cohen, Baltimore, MD (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/837,478

(22) Filed: Apr. 29, 2004

(65) Prior Publication Data

US 2005/0077942 A1 Apr. 14, 2005

Related U.S. Application Data

(60) Provisional application No. 60/510,737, filed on Oct. 10, 2003.

(51) Int. Cl.
*H03H 11/26* (2006.01)
(52) U.S. Cl. ...................................... 327/271; 327/284
(58) Field of Classification Search ........ 327/261–264, 327/269–272, 284–285, 293, 295, 276–277, 327/239, 242, 251, 253, 257–258
See application file for complete search history.

(56) References Cited

U.S. PATENT DOCUMENTS

| | | | |
|---|---|---|---|
| 5,644,261 A | 7/1997 | Frisch et al. | 327/277 |
| 5,812,832 A | 9/1998 | Horne et al. | 395/556 |
| 5,909,133 A * | 6/1999 | Park | 327/277 |
| 5,923,199 A * | 7/1999 | Kikuchi | 327/269 |
| 6,016,282 A | 1/2000 | Keeth | 365/233 |
| 6,054,884 A * | 4/2000 | Lye | 327/269 |
| 6,115,318 A | 9/2000 | Keeth | 365/233 |
| 6,222,406 B1 * | 4/2001 | Noda et al. | 327/269 |
| 6,483,364 B2 * | 11/2002 | Choi et al. | 327/295 |
| 6,486,722 B2 * | 11/2002 | Yamauchi | 327/270 |
| 6,570,425 B2 * | 5/2003 | Yamaguchi | 327/251 |
| 6,777,995 B1 * | 8/2004 | Harrison | 327/271 |
| 7,042,265 B2 * | 5/2006 | Harrison | 327/271 |
| 2001/0017558 A1 | 8/2001 | Hanzawa et al. | 327/165 |

* cited by examiner

*Primary Examiner*—My-Trang Nu Ton
(74) *Attorney, Agent, or Firm*—Schneck & Schneck; Thomas Schneck

(57) ABSTRACT

A vernier time shifting circuit is used for fine-tuning capture of a clock signal and/or a data signal to compensate for fluctuations produced by the system or other variations within non-time invariant parts of the chip. Other variations can include process, temperature, or voltage differences. The vernier sample time shifting circuit allows shifting the signal in small steps to allow for optimal sampling.

12 Claims, 3 Drawing Sheets

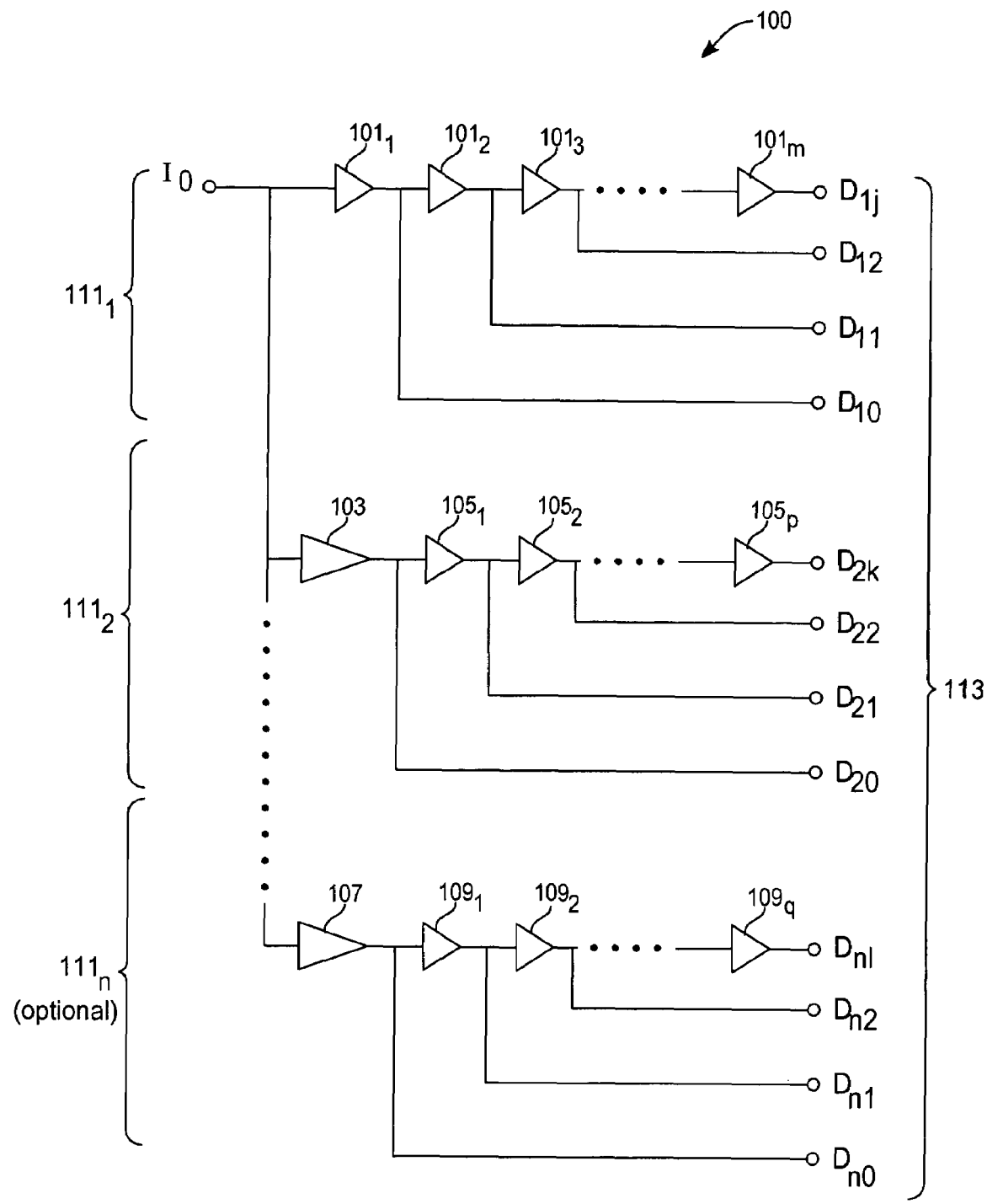
Fig._1

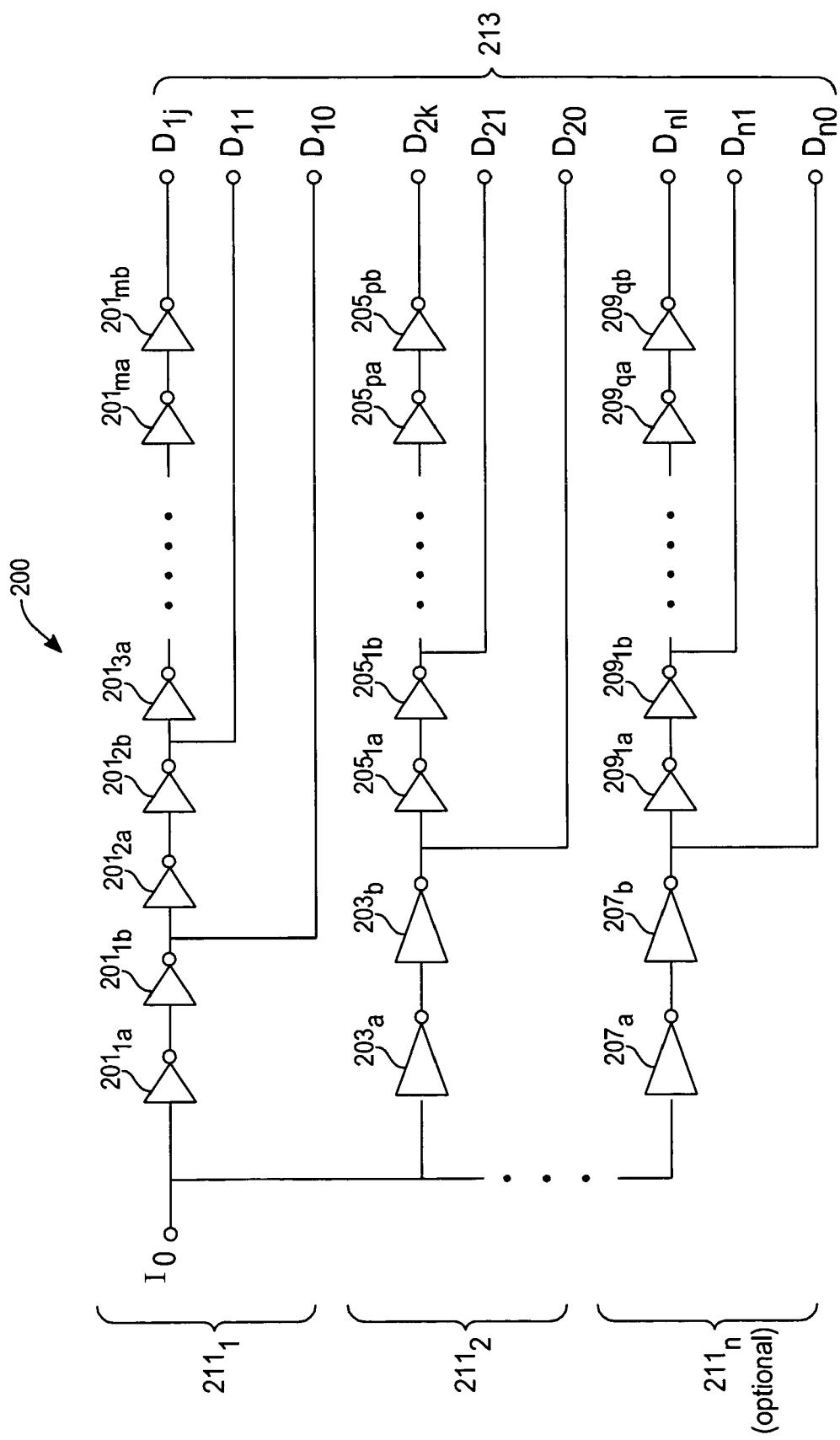
Fig._2

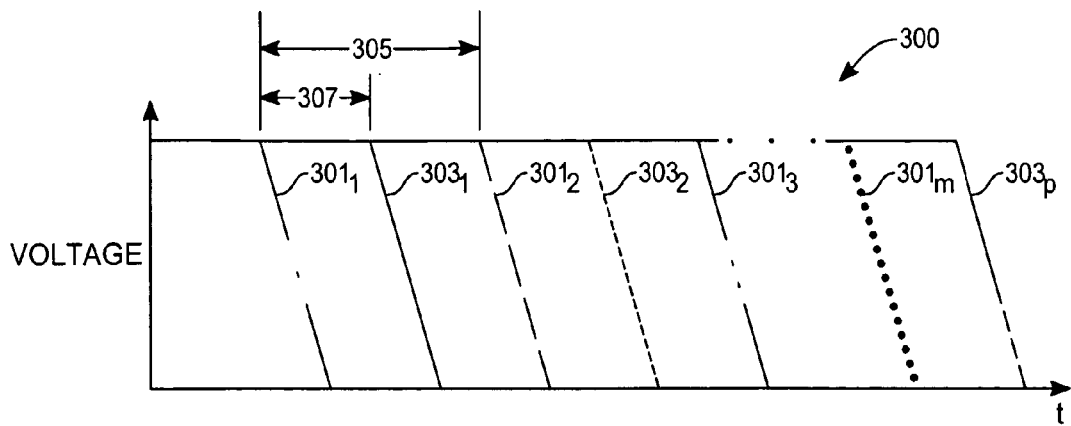
Fig._3
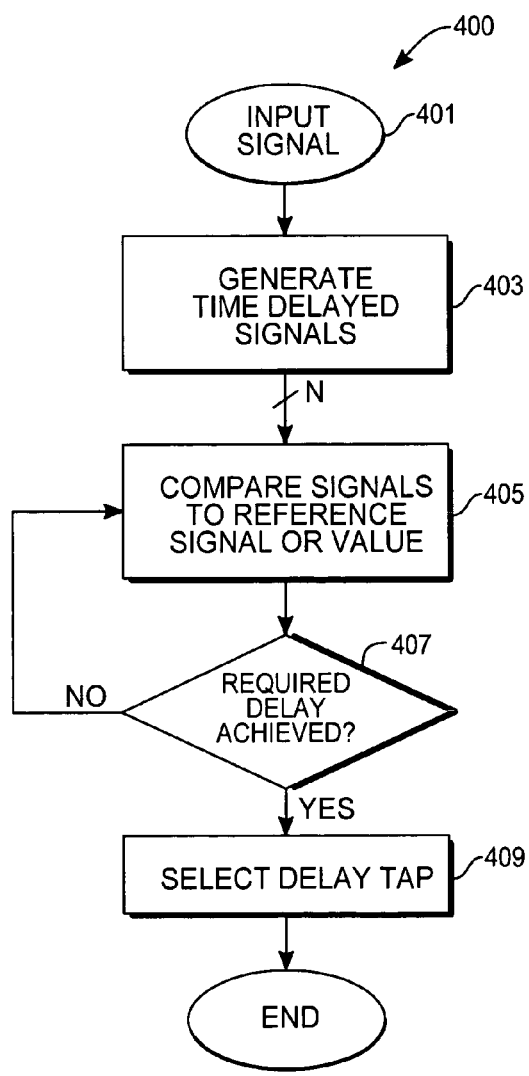
Fig._4

VERNIER CIRCUIT FOR FINE CONTROL OF SAMPLE TIME

CROSS REFERENCE RELATED TO APPLICATION

This application claims priority from U.S. provisional application No. 60/510,737, filed Oct. 10, 2003.

TECHNICAL FIELD

A present invention described herein relates generally to clock and data signals used by electronic circuits and specifically, to a circuit and method for shifting the signals in small steps.

BACKGROUND ART

To address a need for faster circuits, a group of integrated circuits can be combined on a common bus and be controlled by a common controller. In such a configuration, each integrated circuit operates in a coordinated manner with other integrated circuits to share data which is transmitted at a high speed. For example, a group of memory devices, such as DRAMs, EEPROMs, or read only memories (ROM), can be connected to a common data bus and be controlled by a memory controller to form a memory system. However, a data rate of the bus may be substantially faster than the maximum operating speed of the individual memories thereby requiring that the data be delayed. Each memory device, therefore, is operated so that while one memory is processing received data, another memory is receiving new data. Such a memory system, with an appropriate number of memory devices and an efficient memory controller, can achieve extremely high speed data transmissions, but an optimal speed can be achieved only if each integrated circuit on the bus can be delayed, as needed, to account for variances within each integrated circuit.

As a transmission rate of the data communication signals in such memory systems continues to increase, new circuitry and methods are needed to accurately clock command data, write data, and read data transmitted between the memory controller and the memory devices. A portion of a clock cycle which can be devoted to clocking valid data becomes quite small, and errors in clocking data can occur at increased transmission speeds because of known effects such as duty cycle variation, bus position of a given memory device, timing drift, loading variations, etc. Therefore, it is desirable to provide small data and/or clock delays to reduce or eliminate deleterious effects of the variations of duty cycle, bus position and so on as stated above.

Further, internal circuit paths are greatly affected by integrated circuit processing parameters, circuit operating temperature, and an operating supply voltage of the circuit. For example, an integrated circuit executes more slowly as operating temperature increases. Integrated circuits also operate more slowly as the operating supply voltage decreases. In either or both of these cases, the duration of the first and second clock signal phases must be extended to provide first and second execution times which are sufficient to accommodate increased first and second minimum execution time periods.

In all of the aforementioned cases, a fine-resolution time delay could alleviate or minimize the problems described. A proper time delay can eliminate or minimize bottle-necks and choke-points in a circuit and can thereby improve an overall circuit throughput when each part of a circuit is operating at its optimum speed. Prior art attempts to provide extremely fine-resolution time delays have been unsuccessful. For example, U.S. Pat. Nos. 6,115,318 and 6,016,282 to Keeth, U.S. Pat. No. 5,812,832 to Horne et al., U.S. Pat. No. 5,644,261 to Frisch et al., and U.S. Patent Application Publication No. 2001/0017558 to Hanzawa et al. each teach a vernier circuit that allows a signal to be shifted in small steps and incorporate a second vernier branch circuit in parallel with a first vernier circuit. These circuits depend on a propagation delay through a time delay element, such as a buffer, to provide for time delays. However, none of these referenced circuits describe or suggest a way to provide for a time shift that is less than a propagation delay of any of the time delay elements. Prior art sampling systems are unable to compensate for fine-resolution variations in sample timing or to select an optimal delay time. Nor do any of the prior art systems provide a method for integrated circuits to compensate for throughput due to variations such as reduced supply voltage or increased operating temperatures.

Therefore, what is needed is an electronic circuit to provide fine-resolution time delays in incremental steps and a method to determine which of those incremental steps is optimal for a given circuit.

DISCLOSURE OF THE INVENTION

A vernier time delay circuit of the present invention allows a signal to be shifted in small steps over a specified range to compensate for variables in an electronic circuit or system to achieve optimal sampling. Variables may come from, for example, process, temperature, or voltage changes within non-time invariant parts of a chip. The vernier time delay circuit of the present invention is programmable and allows shifting a clock signal or data signal in small increments to find an optimal sampling time on a chip-by-chip basis. For example, a 10 picosecond shifting step may be selected. Further, either a clock or a data signal may be shifted through vernier time delay circuits. Therefore, a clock signal can effectively shift backwards in time relative to a data signal when both the data signal and the clock signal are running through vernier time delay circuits.

Thus, the present invention is an electronic device for producing fine delays in a sample signal. The device comprises a first plurality of delay means coupled in series and producing a first circuit branch. A second circuit branch, which includes a second plurality of delay means coupled in series with each other, is coupled in parallel with the first circuit branch. Additionally, an offset delay means is coupled in series with the second circuit branch. The offset delay means is selected to have a delay value different from each of the first plurality of delay means. A plurality of taps is coupled to an output of each of the delay means to allow a coupling of an external circuit to the electronic device. Additionally, optional additional circuit branches, each including an additional plurality of delay means coupled in series with each other, are coupled in series with the first and second circuit branches. Each of the additional optional circuit branches also includes an offset delay means coupled in series with the additional plurality of delay means.

The present invention is also a method for selecting a delay tap to compensate for variables in a circuit or system to achieve optimal sampling. The method comprises inputting a signal and generating a plurality of time delayed signals based on the original input signal. The plurality of time delayed signals is compared with a reference to determine whether a required delay is achieved. A delay tap is then selected based on the plurality of time delayed signals generated and the signal comparison.

BRIEF DESCRIPTION OF THE DRAWINGS

FIG. 1 is an exemplary embodiment of a vernier time delay circuit of the present invention.

FIG. 2 is an alternative exemplary embodiment of a vernier time delay circuit of the present invention.

FIG. 3 is an exemplary timing diagram of an output voltage from output taps of the vernier time delay circuit of FIG. 1 or 2.

FIG. 4 is an exemplary method of selecting an output delay tap of the vernier time delay circuit of FIG. 1 or 2 to achieve a particular delay.

BEST MODE FOR CARRYING OUT INVENTION

With respect to FIG. 1, an exemplary embodiment of a vernier time delay circuit 100 includes a plurality of signal delay branches $111_1, 111_2, \ldots, 111_n$ and a plurality of output delay taps 113. A first signal delay branch $111_1$ includes a plurality of first buffers (e.g., voltage followers) $101_1, 101_2, \ldots, 101_m$. In parallel with the first signal delay branch $111_1$ is at least a second signal delay branch $111_2$ and an optional plurality of additional branches, such as an $n^{th}$ signal delay branch $111_n$. Multiple branches of the vernier time delay circuit 100 may be used to increase an overall precision of differential time control. The second through optional $n^{th}$ signal delay branches each contain an offset buffer 103, 107, followed in series by a plurality of buffers $105_1, 105_2, \ldots, 105_p$ and $109_1, 109_2, \ldots, 109_q$. All buffers may be chosen to have the same or similar propagation delay. However, the offset buffers 103, 107 are chosen to have a different propagation delay than the plurality of first buffers $101_1, 101_2, \ldots, 101_m$.

For example, if all buffers are chosen to have a propagation delay of 100 picoseconds, and the offset buffers 103, 107 have a propagation delay of 150 picoseconds and 175 picoseconds, respectively, then Table 1 shows a time delay for each of the delay output taps 113.

With respect to FIG. 2, another exemplary embodiment of a vernier time delay circuit 200 includes a plurality of signal delay branches $211_1, 211_2, \ldots, 211_n$ and a plurality of output delay taps 213. A first signal delay branch $211_1$ includes a plurality of pairs of first inverters $201_{1a}, 201_{1b}, \ldots, 201_{ma}, 201_{mb}$. Unlike the vernier time delay circuit 100, the embodiment in FIG. 2 uses inverter pairs, rather than buffers. Since an inverter always produces a complement of an input signal, a second inverter is needed to re-invert an output from the first inverter. An inverter pair assumes that a correct "phase" of a signal is required. If phase is unimportant, inverter pairs are not needed, and taps between each inverter may be used.

In parallel with the first signal delay branch $211_1$ is at least a second signal delay branch $211_2$ and an optional plurality of additional branches, such as an $n^{th}$ signal delay branch $211_n$. Multiple branches of the vernier time delay circuit 200 may be used to increase an overall precision of differential time control. The second through optional $n^{th}$ signal delay branches each contain an offset inverter pair $203_a, 203_b$ and $207_a, 207_b$, followed in series by a plurality of inverter pairs $205_{1a}, 205_{1b}, \ldots, 205_{pa}, 205_{pb}$ and $209_{1a}, 209_{1b}, \ldots, 209_{pa}, 209_{pb}$. All inverter pairs may be chosen to have the same or similar propagation delays. However, the inverter pairs $203a, 203b$ and $207a, 207b$ are chosen to have a different propagation delay than the plurality of first inverter pairs $201_{1a}, 201_{1b}, \ldots, 201_{ma}, 201_{mb}$.

For example, if all inverters are chosen to have a propagation delay of 100 picoseconds, and the offset inverters $203_a, 203_b$ have a propagation delay of 150 picoseconds each, and the offset inverters $207_a, 207_b$ have a propagation delay of 175 picoseconds each, then Table 2 shows a time delay for each of the delay output taps 213.

TABLE 2

| OUTPUT | $D_{1j}$ | $D_{11}$ | $D_{10}$ | $D_{2k}$ | $D_{21}$ | $D_{20}$ | $D_{n1}$ | $D_{n1}$ | $D_{n0}$ |
|---|---|---|---|---|---|---|---|---|---|
| DELAY (ps) | 100 · 2m | 400 | 200 | 2(150) + 100 · 2p | 500 | 300 | 2(175) + 100 · 2q | 550 | 350 |

With respect to FIG. 3, an exemplary delay output timing diagram 300 has a first set of waveforms $301_1, 301_2, \ldots, 301_m$ representing an output from a signal delay from either of the vernier time delay circuits 100, 200 as measured at a first set of the output delay taps 113, 213 (e.g., from output delay taps $D_{10}, D_{11}, \ldots, D_{1j}$). A time delay 305 indicates a generated time delay between successive output delay taps. Each of a second set of waveforms $303_1, 303_2, \ldots, 303_p$ represents an output from a signal delay from either of the vernier time delay circuits 100, 200 as measured at a second set of the output delay taps 113, 213 (e.g., from output delay taps $D_{20}, D_{21}, \ldots, D_{2k}$). A differential time

TABLE 1

| OUTPUT | $D_{1j}$ | $D_{12}$ | $D_{11}$ | $D_{10}$ | $D_{2k}$ | $D_{22}$ | $D_{21}$ | $D_{20}$ | $D_{n1}$ | $D_{n2}$ | $D_{n1}$ | $D_{n0}$ |
|---|---|---|---|---|---|---|---|---|---|---|---|---|
| DELAY (ps) | 100 · m | 300 | 200 | 100 | 150 + 100 · p | 350 | 250 | 150 | 175 + 100 · q | 375 | 275 | 175 | delay 307 indicates a signal time difference between outputs of the first signal delay branch $111_1, 211_1$ and the second signal delay branch $111_2, 211_2$, thereby graphically indicating how fine-resolution time delays are generated. For example, a clock signal sampled at tap $D_{10}$ (FIG. 1) and a data signal sampled at tap $D_{20}$ will have a delay of 50 picoseconds (see Table 1). Shorter time delays can be realized by, for example, choosing a first of the plurality of buffers $101_1$ and the offset buffer 103 to have a minimal differential propagation delay (e.g., 100 and 110 picoseconds respectively results in a differential time delay of 10 picoseconds).

Additionally, even finer delay steps (i.e., a delay less than a shortest propagation delay of any of the buffer components) may be realized by tapping outputs from similar circuits for the data signal and the clock signal. For example, a data signal and a clock signal are each input into similar delay circuits 100, a data signal delay circuit $100_d$ and a clock signal delay circuit $100_c$ ($100_c$ and $100_d$ are not shown as distinct circuits). A data signal delay branch $111_{d1}$ of the data signal delay circuit $100_d$ has a first offset buffer $103_d$ with a propagation delay of 100 picoseconds. A clock signal delay branch $111_{c2}$ of the clock signal delay circuit $100_c$ has a first offset buffer $103_c$ with a propagation delay of 110 picoseconds. Therefore, an output time difference between the data signal delay branch $111_{d1}$ and the clock signal delay branch $111_{c2}$ is 10 picoseconds.

With respect to FIG. 4, an exemplary method for a delay tap selection process 400 adjusts for variables (e.g., process variations, temperature variations, described supra) by selecting at least one of a plurality of output delay taps 113, 213. An input signal is entered 401 into the vernier time delay circuit 100, 200. The signal may be either a clock signal or a data signal. The vernier time delay circuit 100, 200 generates 403 a plurality of N time-delay signals, each of the plurality of time-delay signals being delayed by a time in accordance with values selected for components of the vernier time delay circuit 100, 200 described herein. The signals are compared 405 (e.g., in one or more balanced path delay decoders, not shown) to a reference signal or an expected value (e.g., the value may be electrically generated, calculated, or selected from a look-up table). A determination is made whether a required delay is achieved 407 based on the comparison step 405. If the required delay is not achieved, the comparison step 405 is repeated until the delay is achieved 407. Once the required delay is achieved 407, a delay tap associated with the required delay is selected 409 by the one or more balanced path delay decoders and the delay tap selection process 400 is complete.

To facilitate an understanding of the present invention, a variety of exemplary embodiments have been described that allow a signal to be shifted in small steps over a specified range to compensate for variables in a circuit or system to achieve optimal sampling. Although not expressly presented, one of skill in the art could envision changes to the circuit that could accomplish a same or similar purpose. For example, a hybrid vernier time delay circuit could be constructed that employs delay elements incorporating both buffers and inverters rather than exclusively one delay element or the other as presented herein. Additionally, other signal delay elements could be substituted for the buffers and/or inverters and still be within the scope of the present invention. Therefore, a scope of the present invention shall only be limited by the scope of the appended claims.

What is claimed is:

1. An electronic device for producing fine delays in a sample signal comprising:
   a first circuit branch having a first plurality of fixed delay means coupled in series, the first circuit branch being coupled to an input node;
   a second circuit branch, coupled to the input node, the second circuit branch having a second plurality of the fixed delay means coupled in series;
   each of the first and second plurality of fixed delay means having substantially the same fixed propagation delay value;
   the first of the second plurality of fixed delay means of the second circuit branch having a fixed delay value different from each of the fixed delay means of the first circuit branch; and
   a plurality of taps configured to allow a coupling of an output of each fixed delay means directly to an external circuit.

2. The electronic device of claim 1, wherein the pluralities of fixed delay means comprise voltage followers.

3. The electronic device of claim 1, wherein the pluralities of fixed delay means comprise inverters.

4. The electronic device of claim 1, wherein the pluralities of fixed delay means comprise voltage followers and inverters.

5. The electronic device of claim 1 further comprising one or more additional circuit branches, wherein each of the one or more additional circuit branches includes a plurality of fixed delay means, the first fixed delay means of the plurality of fixed delay means of each additional branch having a delay fixed propagation value different from the delay value of every other fixed delay means, each of the one or more additional circuit branches coupled in parallel with each other and with the first circuit branch.

6. The electronic device of claim 5, wherein the additional fixed delay means comprises voltage followers.

7. The electronic device of claim 5, wherein the additional fixed delay means comprises inverters.

8. An electronic device for producing fine delays in a sample signal comprising:
   a first circuit branch, having a plurality of voltage followers coupled in series, coupled to an input node;
   a second circuit branch, coupled to the input node, the second circuit branch having a plurality of voltage followers coupled in series;
   each of the voltage followers having substantially the same fixed propagation delay value;
   the first of the plurality of voltage followers of the second circuit branch having a fixed delay value different from each of the voltage followers of the first circuit branch; and
   a plurality of taps configured to allow a coupling of the output of each voltage follower directly to an external circuit.

9. The electronic device of claim 8 further comprising one or more additional circuit branches wherein each of the one or more additional circuit branches includes a plurality of voltage followers, the first voltage followers of the plurality of voltage followers of each additional branch having a fixed delay value different from the delay value of every other voltage follower, each of the one or more additional circuit branches coupled in parallel with each other and with the first circuit branch.

10. An electronic device for producing fine delays in a sample signal comprising:
   a first circuit branch, having a plurality of inverters coupled in series, the first circuit branch being coupled to an input node;
   a second circuit branch, coupled to the input node, having a plurality of inverters coupled in series;
   each of the inverters having substantially the same fixed propagation delay value;

the first of the plurality of inverters of the second circuit branch having a fixed delay value different from each of the inverters of the first circuit branch; and a plurality of taps configured to allow a direct coupling of the output of each inverter to an external circuit.

11. The electronic device of claim 10 further comprising one or more additional circuit branches wherein each of the one or more additional circuit branches includes a plurality of inverters, the first inverter of the plurality of inverters of each additional branch having a fixed delay value different from the fixed delay value of every other inverter, each of the one or more additional circuit branches coupled in parallel with each other and with the first circuit branch.

12. The electronic device of claim 11 wherein the plurality of inverters are coupled in pairs.

* * * * *